United States Patent
Yamaguchi et al.

(10) Patent No.: US 6,879,005 B2
(45) Date of Patent: Apr. 12, 2005

(54) HIGH WITHSTAND VOLTAGE SEMICONDUCTOR DEVICE

(75) Inventors: Yoshihiro Yamaguchi, Saitama (JP); Akio Nakagawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/790,015

(22) Filed: Mar. 2, 2004

(65) Prior Publication Data

US 2004/0251499 A1 Dec. 16, 2004

(30) Foreign Application Priority Data

Jun. 11, 2003 (JP) ........................ 2003-166419

(51) Int. Cl.⁷ .................... H01L 29/76; H01L 29/94; H01L 31/062; H01L 31/113; H01L 31/119
(52) U.S. Cl. .................. 257/367; 257/409; 257/488; 257/489; 257/508
(58) Field of Search ................... 257/367, 409, 257/488–489, 508

(56) References Cited

U.S. PATENT DOCUMENTS

| | | | |
|---|---|---|---|
| 5,541,439 A | | 7/1996 | Mojaradi et al. |
| 6,150,702 A | | 11/2000 | Funaki et al. |
| 6,190,948 B1 | | 2/2001 | Seok |
| 6,246,101 B1 | * | 6/2001 | Akiyama ............. 257/508 |
| 2001/0004124 A1 | * | 6/2001 | Noda et al. ........... 257/401 |

FOREIGN PATENT DOCUMENTS

| | | |
|---|---|---|
| JP | 10-341018 | 12/1998 |
| JP | 2002-353448 | 12/2002 |

* cited by examiner

Primary Examiner—Thien F Tran
(74) Attorney, Agent, or Firm—Oblon, Spivak, McClelland, Maier & Neustadt P.C.

(57) ABSTRACT

A high withstand voltage semiconductor device, comprises: a substrate, a semiconductor layer formed on an upper surface of the substrate, a lateral semiconductor device formed in a surface region of the semiconductor layer and having a first principal electrode in its inner location and a second principal electrode in its outer location so as to let primary current flow between the first and second principal electrodes, a field insulation film formed inside from the second principal electrode in an upper surface of the semiconductor layer to surround the first principal electrode, a resistive field plate formed on an upper surface of the field insulation film to surround the first principal electrode and sectioned in a plurality of circular field plates in an approximate circular arrangement orbiting gradually from the vicinity of the first principal electrode toward the second principal electrode, the innermost one of the circular field plates being electrically connected to the first principal electrode while the outermost one is electrically connected to the second principal electrode, and the resistive field plate including coupling field plates which respectively connect adjacent ones of the circular field plates, and a conductive field plate shaped in a floating state right above spaces defined between pairs of the adjacent circular field plates, an interlayer insulation film being interposed between the conductive field plate and the resistive field plate or the circular field plates, and upon an application of voltage between the first and second principal electrodes, capacities being formed between the conductive field plate and the resistive field plate.

12 Claims, 11 Drawing Sheets

HIGH WITHSTAND VOLTAGE SEMICONDUCTOR DEVICE

CROSS REFERENCE TO RELATED APPLICATIONS

This application is based upon and claims the benefit of priority from the prior Japanese Application No. 2003-166419, filed on Jun. 11, 2003; the entire contents of which are incorporated herein by reference.

BACKGROUND OF THE INVENTION

This invention relates to a high withstand voltage semiconductor device, and more particularly, to a high withstand voltage semiconductor device having a resistive field plate.

One type of high withstand voltage semiconductor devices has a resistive field plate between a high voltage electrode (e.g., anode) and a low voltage electrode (e.g., cathode) which are commonly formed on the same plane of a substrate.

The resistive field plate is intended to make small current to flow therein upon an application of withstand voltage between the high and low voltage electrodes, so as to relieve a surface electric field formed at the substrate between the high and low voltage electrodes.

FIG. 9 is a plan view showing such a prior art high withstand voltage semiconductor device having the resistive field plate while FIG. 10 is a plan view depicting the resistive field plate used for the high withstand voltage semiconductor device in FIG. 9. FIG. 11 is a cross sectional view taken along the line XI—XI of the high withstand voltage semiconductor device in FIG. 9.

As can be seen in FIG. 11, the device has a silicon oxide insulation (SOI) substrate 53 in which a mono-crystalline silicon substrate 51, an insulation film 52 of silicon oxide, and a high resistance n type substrate 54 are stacked. On an upper surface of the n type substrate 54, a p type anode region 55 and an n type cathode region 56 are selectively formed. On an upper surfaces of the p type node region 55 and the n type cathode region 56, respectively, a p type contact region 58 and an n type contact region 59 both of high impurity concentration are selectively formed.

On the surface of the n type substrate 54 between the p type anode region 55 and the n type cathode region 56, a so-called LOCOS (localized oxidation of silicon) film 60 is formed by means of selective oxidation. On the LOCOS film 60, a vortex planar pattern resistive field plate 61 is formed of polysilicon (see FIG. 10).

As especially can be seen in FIG. 9, the resistive field plate 61 consists of three components, namely, an annular first resistive field plate $61_1$ connected to the anode 62, a second resistive field plate $61_2$ surrounded by the first resistive field plate $61_1$ and connected to the cathode 63, a vortex resistive field plate 61a having one end connected to the resistive field plate 61, and the other end connected to the second resistive field plate $61_2$. In FIG. 11, a reference numeral 64 denotes an interlayer insulation film.

Configured as in FIG. 11, in order to relieve electric field in the surface of the n type substrate 54, or to develop a uniform distribution of the electric field in the surface of the same, a space between the vortex lines (or vortex pitch) should be reduced in the resistive field plate 61a, that is, turns of the vortex should be increased in number.

However, with the reduced space, entry of undesired particles such as dust between the vortex lines during the manufacturing process may cause a short circuit between a pair of the adjacent plates. Thus, the space between vortex lines must be kept a certain distance to avoid the above disadvantage, and this imposes a restriction to the prior art configuration in enhancing withstand voltage.

In contrast, another high withstand voltage semiconductor device is intended to accomplish increased withstand voltage by providing capacitive coupling field plate on the surface of lateral semiconductor device (refer to Japanese Patent Laid-open (Unexamined) Publication No. 2002-353448.

More specifically, the capacitive coupling field plate of this high withstand voltage semiconductor device is of vertical dual stack structure where a lower layer includes a plurality of annular conductive field plates arranged concentric with one another as if they were floating while an upper layer includes annular conductive field plates each occupying an area right above a space between a pair of the adjacent field plates in the lower layers.

Configured in such a manner, application of voltage between an anode and a cathode, formed are capacities between the anode and the conductive field plates in the lower layer, between the conductive field plates in the lower and upper layers, and between the conductive field plates in the lower layer and the cathode. Thus, the anode and the cathode are connected therebetween by couplings of more than one capacities. This enables the substrate to exhibit a uniform distribution of the electric field in its surface.

In the capacitive coupling field plate structure as mentioned above, however, the conductive field plates do not have their respective potentials fixed at specific levels, and accordingly, the withstand voltage adversely varies.

As has been recognized, when the vortex resistive field plate is applied between the anode and cathode, the space between the vortex lines should be greater due to a restriction of the manufacturing, which results in an insufficient withstand voltage. On the other hand, with the capacitive coupling field plates, the conductive field plates respectively assume unstable potentials, which results in a varied withstand voltage.

SUMMARY OF THE INVENTION

According to the first embodiment of the present invention, there is provided a high withstand voltage semiconductor device, comprising:

a substrate, a semiconductor layer formed on an upper surface of the substrate, a lateral semiconductor device formed in a surface region of the semiconductor layer and having a first principal electrode in its inner location and a second principal electrode in its outer location so as to let primary current flow between the first and second principal electrodes, a field insulation film formed inside from the second principal electrode in an upper surface of the semiconductor layer to surround the first principal electrode, a resistive field plate formed on an upper surface of the field insulation film to surround the first principal electrode and sectioned in a plurality of circular field plates in an approximate circular arrangement orbiting gradually from the vicinity of the first principal electrode toward the second principal electrode, the innermost one of the circular field plates being electrically connected to the first principal electrode while the outermost one is electrically connected to the second principal electrode, and the resistive field plate including coupling field plates which respectively connect adjacent ones of the circular field plates, and a conductive field plate shaped in a floating state right above spaces defined between pairs of the adjacent circular field plates, an interlayer insulation film being interposed between the conductive field plate and the resistive field plate or the circular field plates, and upon an application of voltage between the first and second principal electrodes, capacities being formed between the conductive field plate and the resistive field plate.

According to the second aspect of the present invention, there is provided a high withstand voltage semiconductor device, comprising:

a vertical semiconductor device having first and second principal electrodes in first and second major surfaces of a semiconductor substrate so as to let primary current flows between the first and second principal electrodes, and a terminating region including (i) a field electrode provided in an outer circumferential area in the first major surface of the semiconductor substrate, being spatially isolated in a direction parallel to the major surfaces of the substrate from the first principal electrode, (ii) a field insulation film formed inside from the field electrode in the semiconductor substrate to surround the first principal electrode, (iii) a resistive field plate formed in an upper surface of the field insulation film to surround the first principal electrode and sectioned in a plurality of circular field plates in an approximate circular arrangement orbiting gradually from the vicinity of the first principal electrode toward the field principal electrode, the innermost one of the circular field plates being electrically connected to the first principal electrode while the outermost one is electrically connected to the field electrode, and the resistive field plate including coupling field plates which respectively connect adjacent ones of the circular field plates, and (iv) a conductive field plate shaped like floating islands right above spaces defined between pairs of the adjacent circular field plates, an interlayer insulation film being interposed between the conductive field plate and the resistive field plate or the circular field plates, and upon an application of voltage between the first principal electrode and the field electrode, capacities being formed between the conductive field plate and the resistive field plate.

DETAILED DESCRIPTION OF THE INVENTION (First Embodiment)

Figure 1:
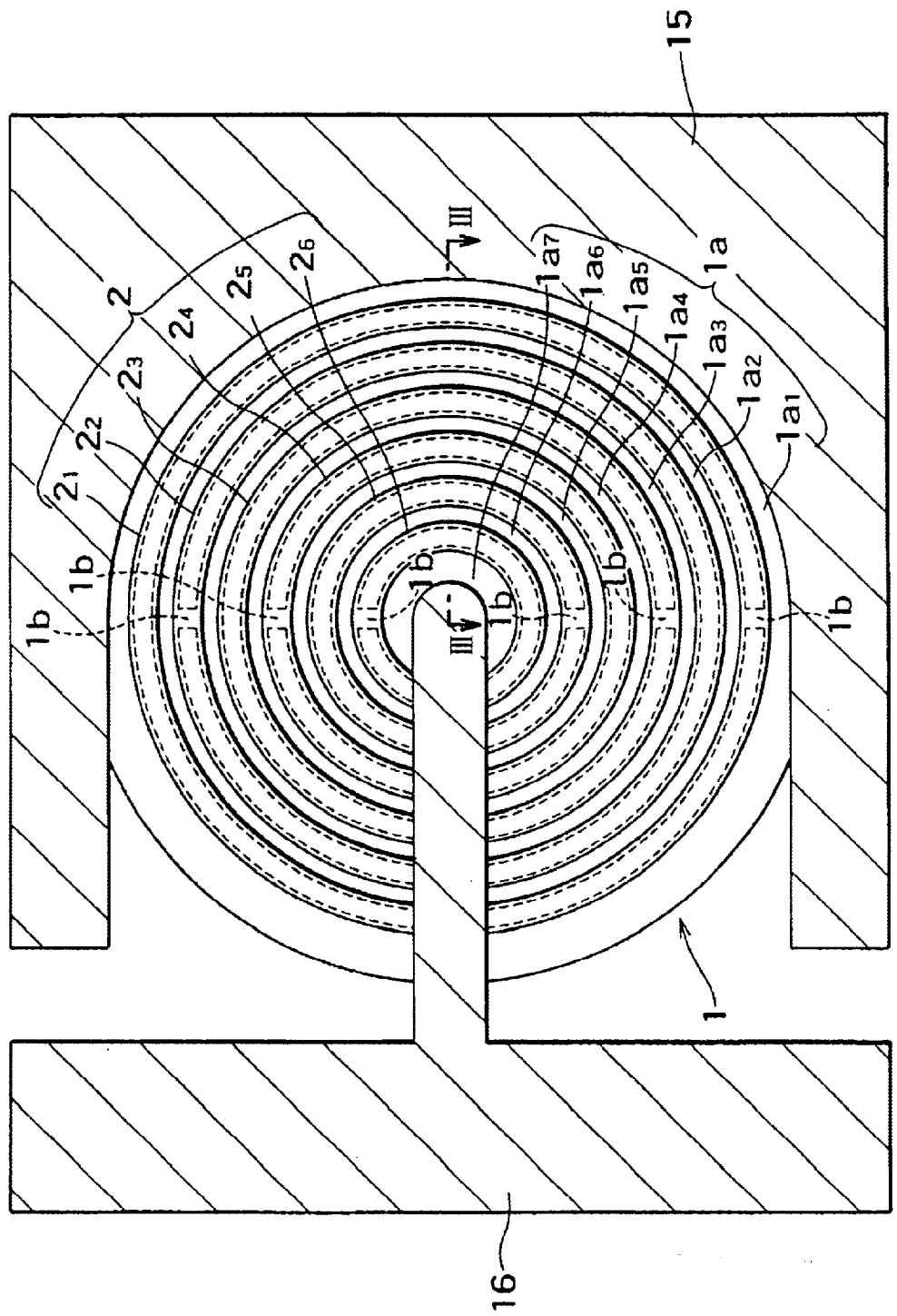
FIG. 1 is a plan view showing a first embodiment of a high withstand voltage semiconductor device according to the present invention.

FIG. 1 is a plan view showing a first embodiment of a high withstand voltage semiconductor device according to the present invention. This high withstand voltage semiconductor device is presented as an example of a lateral diode.

Figure 2:
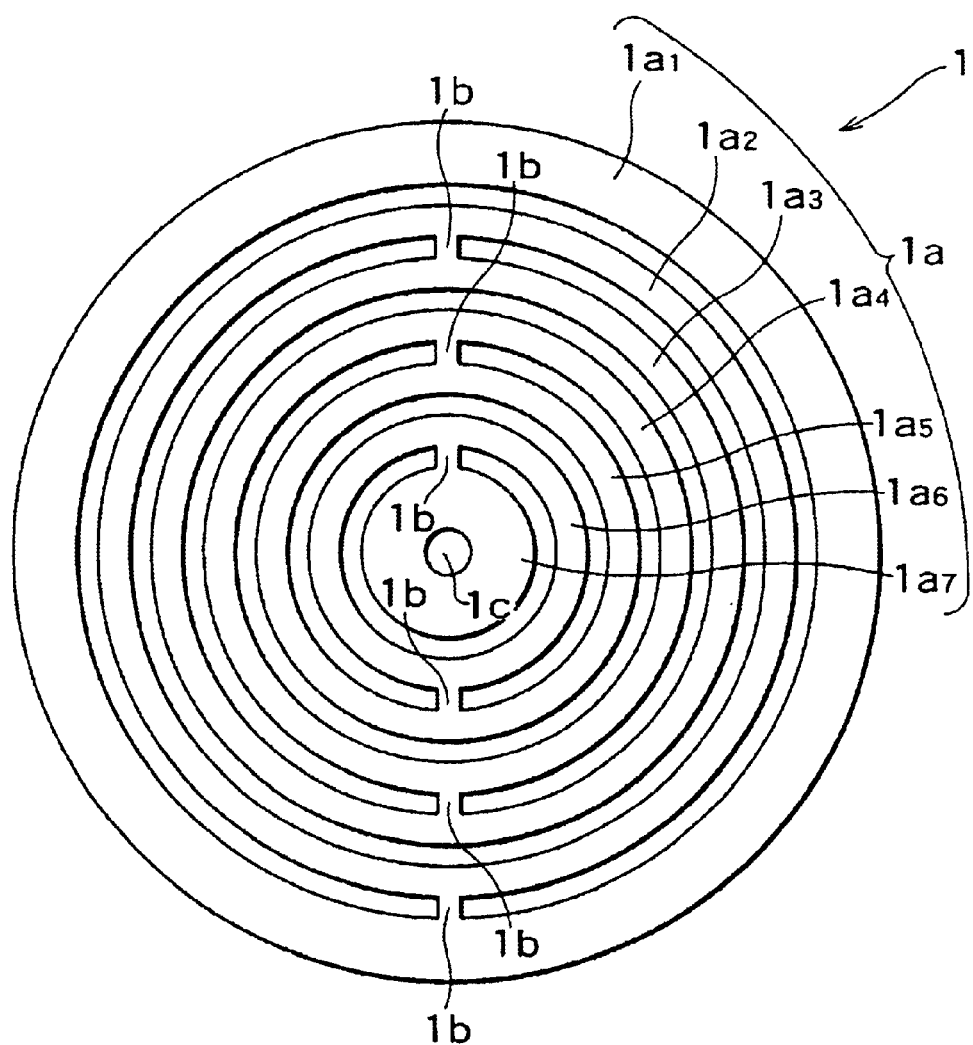
FIG. 2 is a plan view of resistive field plates taken from the high withstand semiconductor device in FIG. 1.
Figure 3:
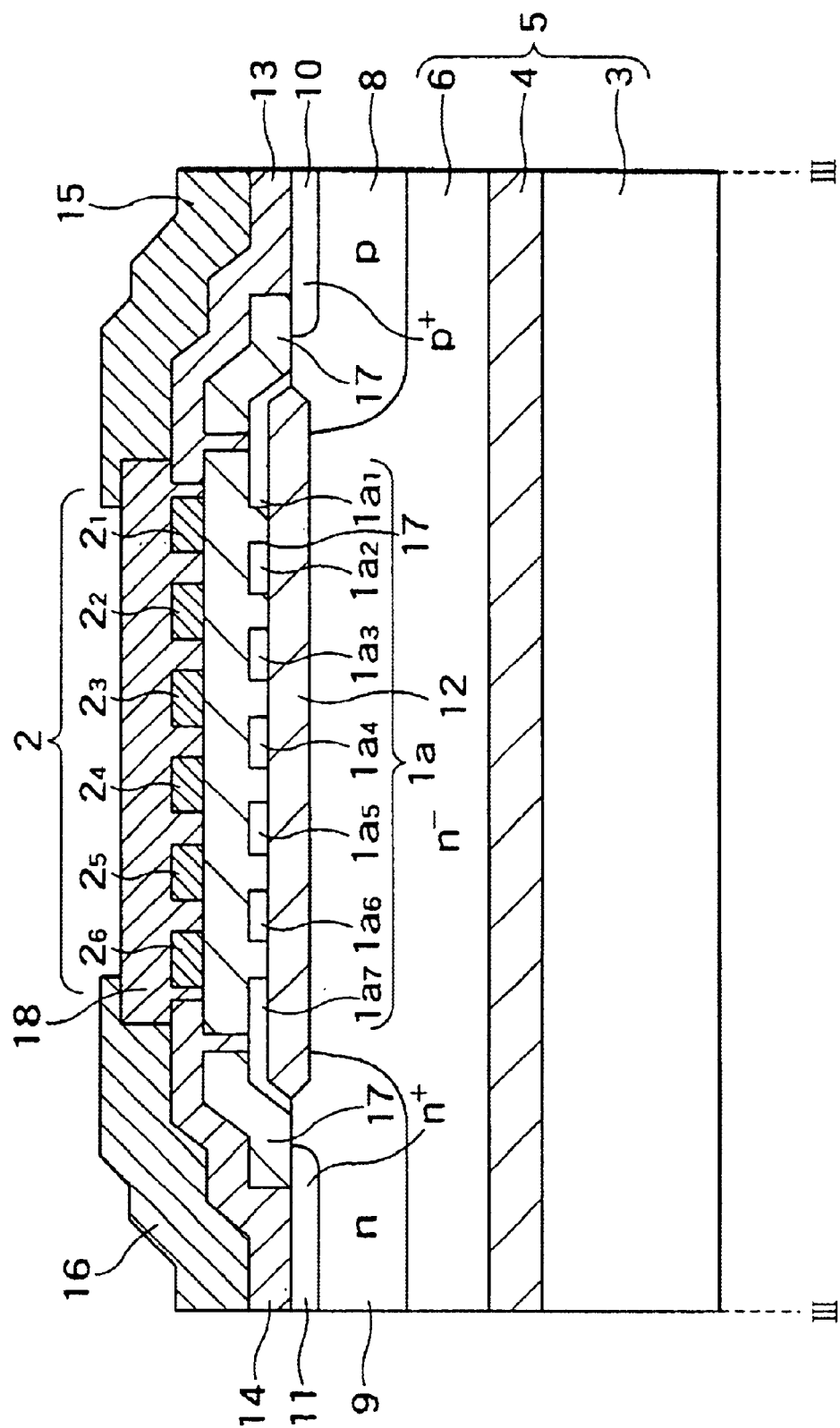
FIG. 3 is a cross-sectional view taken along the line III—III shown in FIG. 1.

FIG. 2 is a plan view showing a resistive field plate in the withstand voltage semiconductor device. FIG. 3 is a cross sectional view taken along the line III–IIII shown in FIG. 1.

The high withstand voltage semiconductor device is comprised of a plurality of concentric annular resistive field plates, band-shaped resistive field plates each connecting a pair of the adjacent resistive field plates, and floating (island-shaped) conductive field plates each occupying an area right above a space between the pair of the adjacent annular resistive field plates.

Referring to FIGS. 1 to 3, the high withstand voltage semiconductor device will now be described.

As can be seen in FIG. 3, a mono-crystalline silicon supporting substrate 3, an insulation film 4 of silicon oxide ($SiO_2$ film), and a high resistance n type substrate 6 are stacked in a SOI substrate 5. In an upper surface of the n type substrate 6, a p type node region 8 and an n type cathode region 9 are selectively formed, respectively. A p type contact region 10 of high impurity concentration is selectively formed in an upper surface of the p type node region 8 while an n type contact region 11 of high impurity concentration is selectively formed in an upper surface of the n type cathode region 9.

In the upper surface of the n type substrate 6 between the p type node region 8 and the n type cathode region 9, a LOCOS film 12 is formed. On the top of the LOCOS film 12, resistive field plate 1 of highly resistive material such as polysilicon is formed.

As depicted in FIG. 2, the resistive field plate 1 consists of a plurality of concentric annular resistive field plates 1a (i.e., resistive field plates $1a_1$ to $1a_7$) and band-shaped resistive field plates 1b each connecting a pair of the adjacent resistive field plates. A reference alphanumeric 1c denotes a hole.

As shown in FIG. 3, the p type contact region 10 is overlaid with a first anode 13 with an interlayer insulation film 17 of silicon oxide intervening therebetween, the first anode 13 being connected to the resistive field plate $1a_1$. The N contact region 11 is superposed with a first cathode 14 with the interlayer insulation film 17 intervening therebetween, the first cathode 14 being connected to the resistive field plate $1a_7$. Thus, the first anode 13 and the first cathode 14 are electrically connected to each other by the interposed resistive field plate 1 of high resistance (i.e., the resistive field plates $1a_1$ to $1a_7$ and the resistive field plates 1b).

The first anode 13 and the first cathode 14 are overlaid and unified with a second anode 15 and a second cathode 16 to have a certain thickness, respectively.

The aforementioned electrodes, namely, the first and second anodes 13 and 15 and the first and second cathodes 14 and 16 are made of material such as aluminum, copper, tungsten, or the like.

Also, as can be seen in FIG. 3, the annular resistive field plates $1a$ and the band-shaped resistive field plates $1b$ (see FIG. 2) are superposed with aluminum conductive field plate 2 (i.e., conductive field plates $2_1$ to $2_6$) with the interlayer insulation film 17 intervening therebetween. The conductive field plate 2 are, as illustrated in FIG. 1, arranged concentric with one another occupying areas right above spaces between the resistive field plates $1a_1$ to $1a_7$ as if they were floating like islands. The conductive field plate 2 are, as shown in FIG. 3, formed in either the same process of creating the first anode 13 and the first cathode 15 or some other process.

Further, a second interlayer insulation film 18 is provided on a surface of the conductive field plate 2.

An operation of the semiconductor device configured as stated above will now be described.

As can be seen in FIG. 3, a positive voltage is applied to the second cathode 16 while a negative voltage is applied to the second anode 15. Thus, the lateral diode is supplied with a reverse voltage (e.g., withstand voltage). Since the second cathode 16 and the second anode 15 are electrically connected to each other with the interposed resistive field plate 1 of high resistance, small current flows from the second cathode 16 to the second anode 15. As a consequence, in FIG. 3, potentials across the resistive field plates, $1a_1$ to $1a_7$, are gradually decreased as they are taken in order from the field plate $1a_7$ toward the field plate $1a_1$.

Figure 4A:
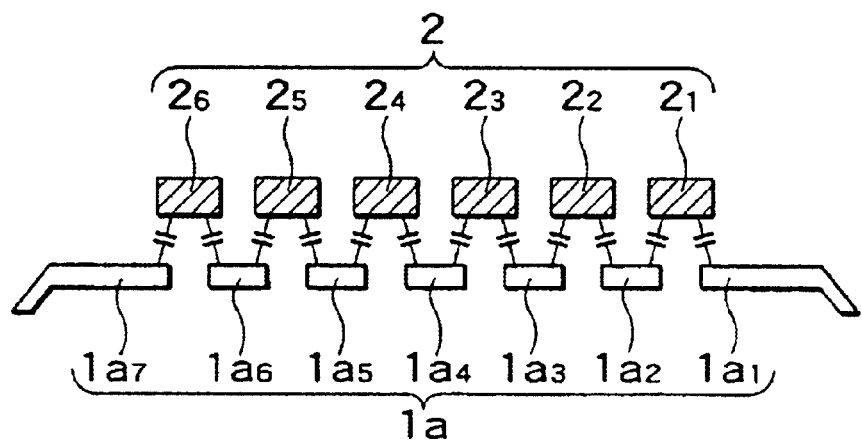
FIGS. 4A and 4B are diagrams illustrating capacities formed between resistive field plates and a conductive field plates.

On the other hand, upon the application of voltage, capacities are formed between the annular resistive field plates $1a$ and the conductive field plate 2 as shown in FIG. 4A.

Figure 4B:
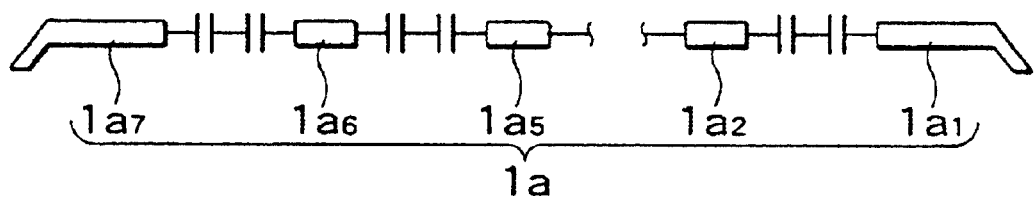

FIG. 4B is an equivalent diagram to FIG. 4A, depicting a relation of capacitive couplings provided therein.

As can be seen in FIG. 4B, the state in FIG. 4A can be regarded as being a plurality of capacitive couplings each formed between a pair of the adjacent resistive field plates. Thus, the potentials between pairs of the adjacent resistive field plates assume a consistently gradual variation from a potential level at the resistive field plate at one end toward that at the opposite end.

As has been recognized, since small current flows in the resistive field plate 1 upon the application of voltage, the resistive field plates $1a_1$ to $1a_7$ have their respective potentials fixed at specific levels, and the variation in potentials across the resistive field plates $1a_1$ to $1a_7$ turns to be consistently gradual from end to end of the field plates; that is, as taken in order from the higher potential terminal or the resistive field plate $1a_7$ toward the lower potential terminal or the resistive field plate $1a_1$, the potentials across the resistive field plates $1a_7$ to $1a_1$ are gradually decreased. The potentials formed in this manner, as in FIG. 3, act upon the surface of the n type substrate 6, and consequently, the surface exhibits a consistently gradual reduction in potential from the first cathode 14 toward the first anode 13. Thus, a depletion layer formed by the p type node region 8 and the n type substrate 6 spreads broader on the left in the drawing. This brings about a high withstand voltage characteristics.

In this embodiment, as has been described, the conductive field plates are each provided right above the space defined between the pair of the adjacent resistive field plates of stable potential to develop capacities along with the resistive field plates, and therefore, a uniform distribution of electric field can be attained although the annular resistive field plates are spaced farther from each other. In other words, even with the resistive field plates provided more apart from each other, the high withstand voltage characteristics can be attained.

In the aforementioned embodiment, as shown in FIG. 1, the conductive field plates $2_1$ to $2_6$ are provided in positions corresponding to spaces defined between adjacent ones of the annular resistive field plates $1a_1$ to $1a_7$, respectively.

Figure 5:
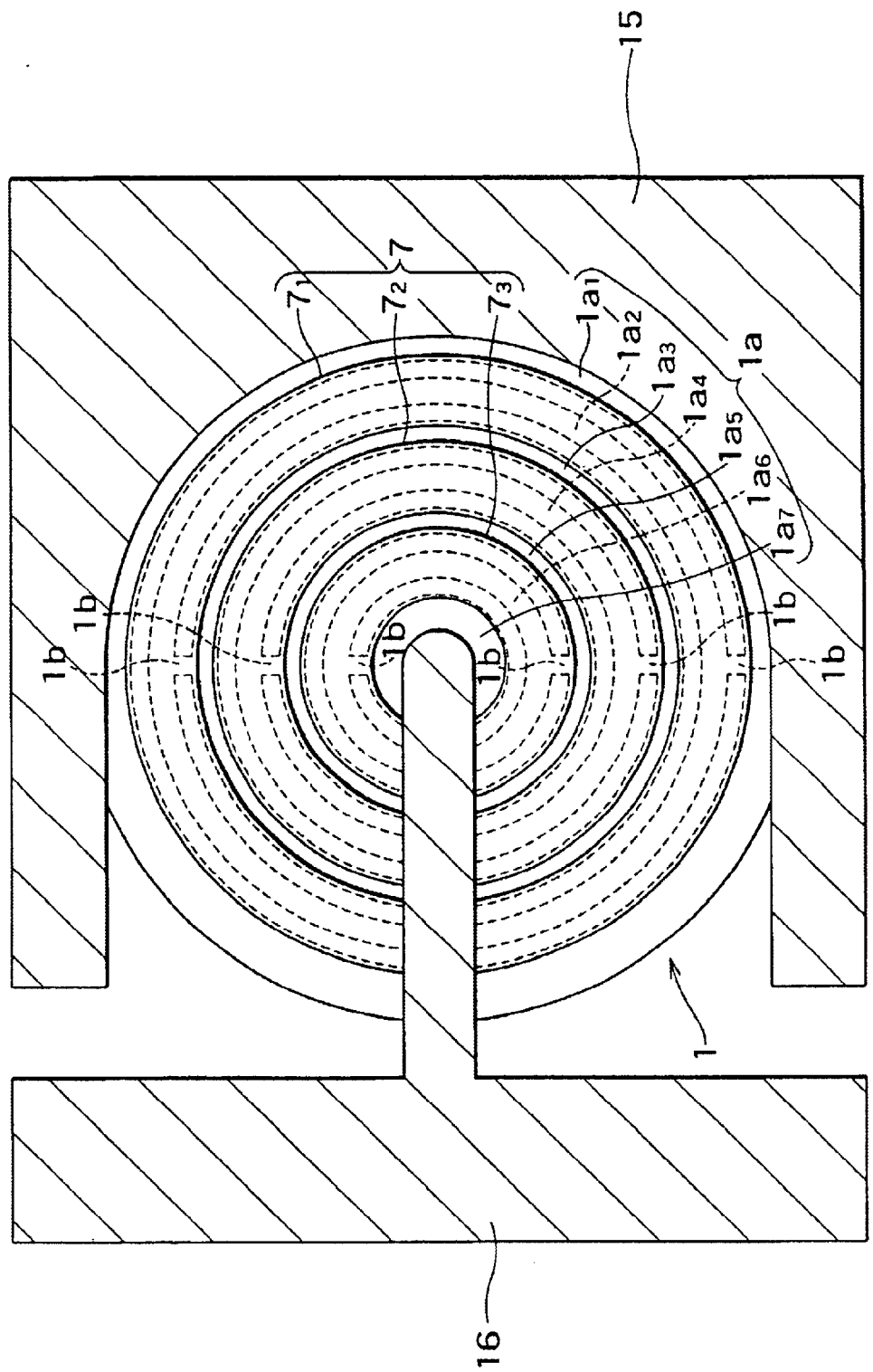
FIG. 5 is a diagram showing an exemplary conductive field plate.

Alternatively, as depicted in FIG. 5, for example, the single conductive field plate (each of field plates $7_1$ to $7_3$) occupies an area right above two of the spaces defined between the adjacent resistive field plates. Configured in this way, a consistently gradual variation in potential can be similarly attained across the resistive field plates $1a_1$ to $1a_7$, and hence, the uniform distribution of electric field can be obtained as in the above.

[Second Embodiment]

Figure 6:
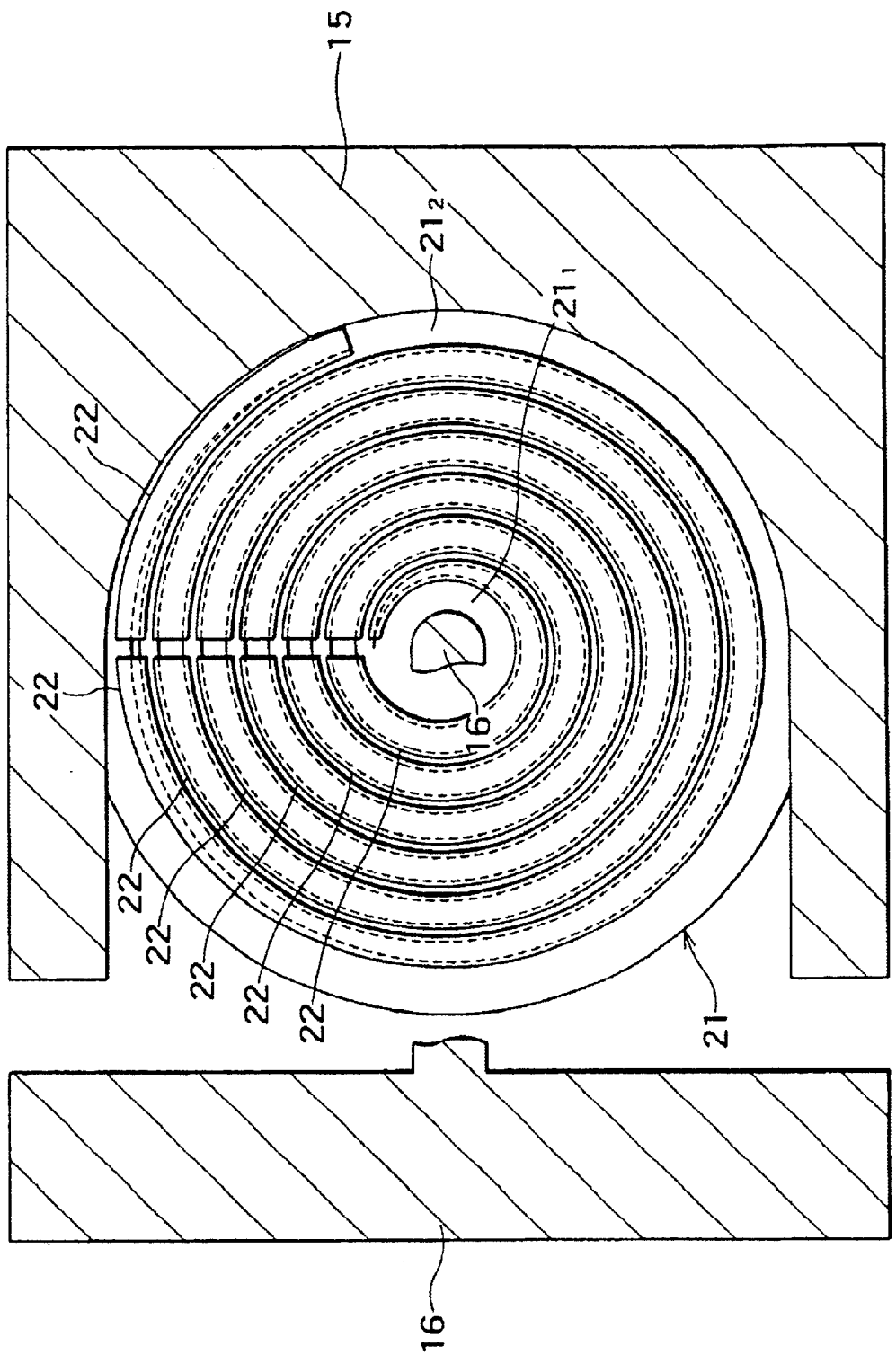
FIG. 6 is a plan view showing a second embodiment of the high withstand voltage semiconductor device.

FIG. 6 is a plan view showing a second embodiment of the high withstand voltage semiconductor device according to the present invention.

Figure 10:
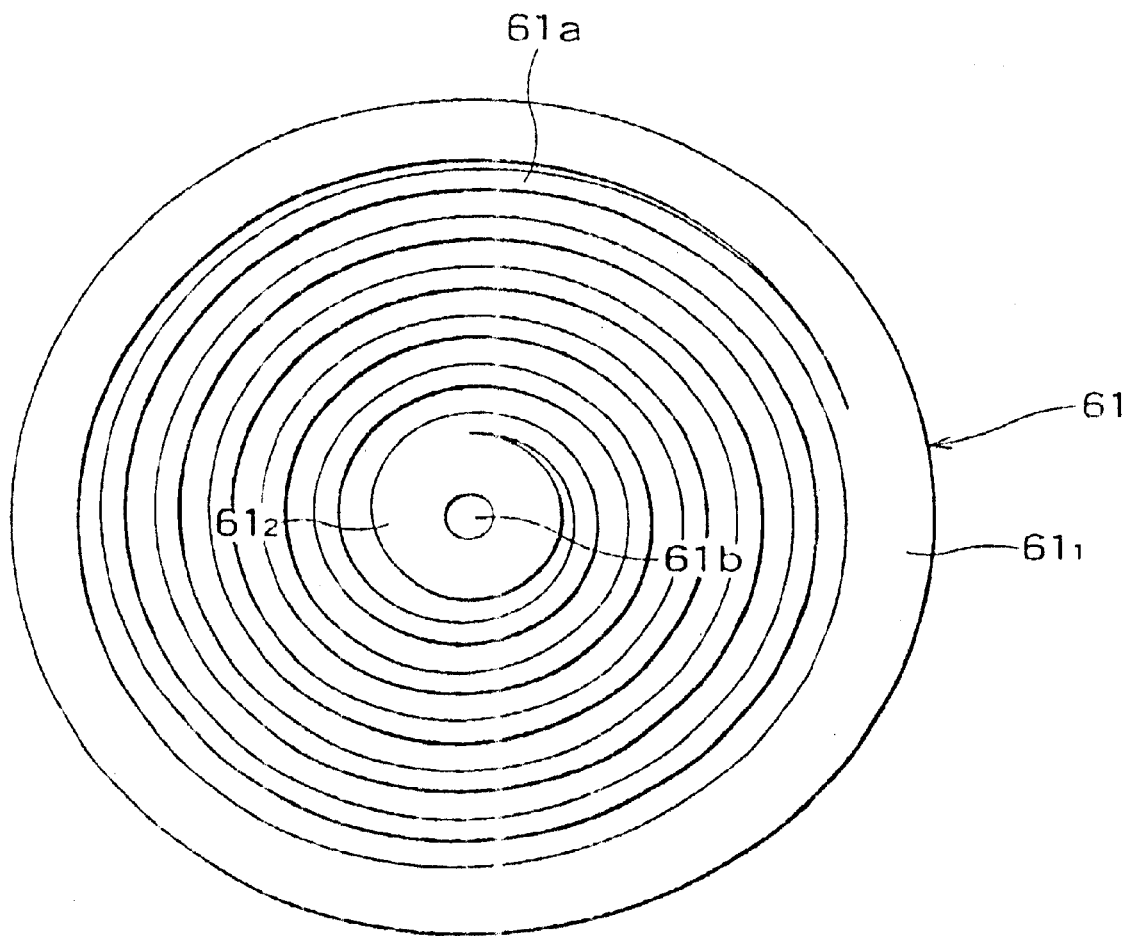
FIG. 10 is a diagram of the field plate taken from the high withstand voltage semiconductor device in FIG. 9.
Figure 11:
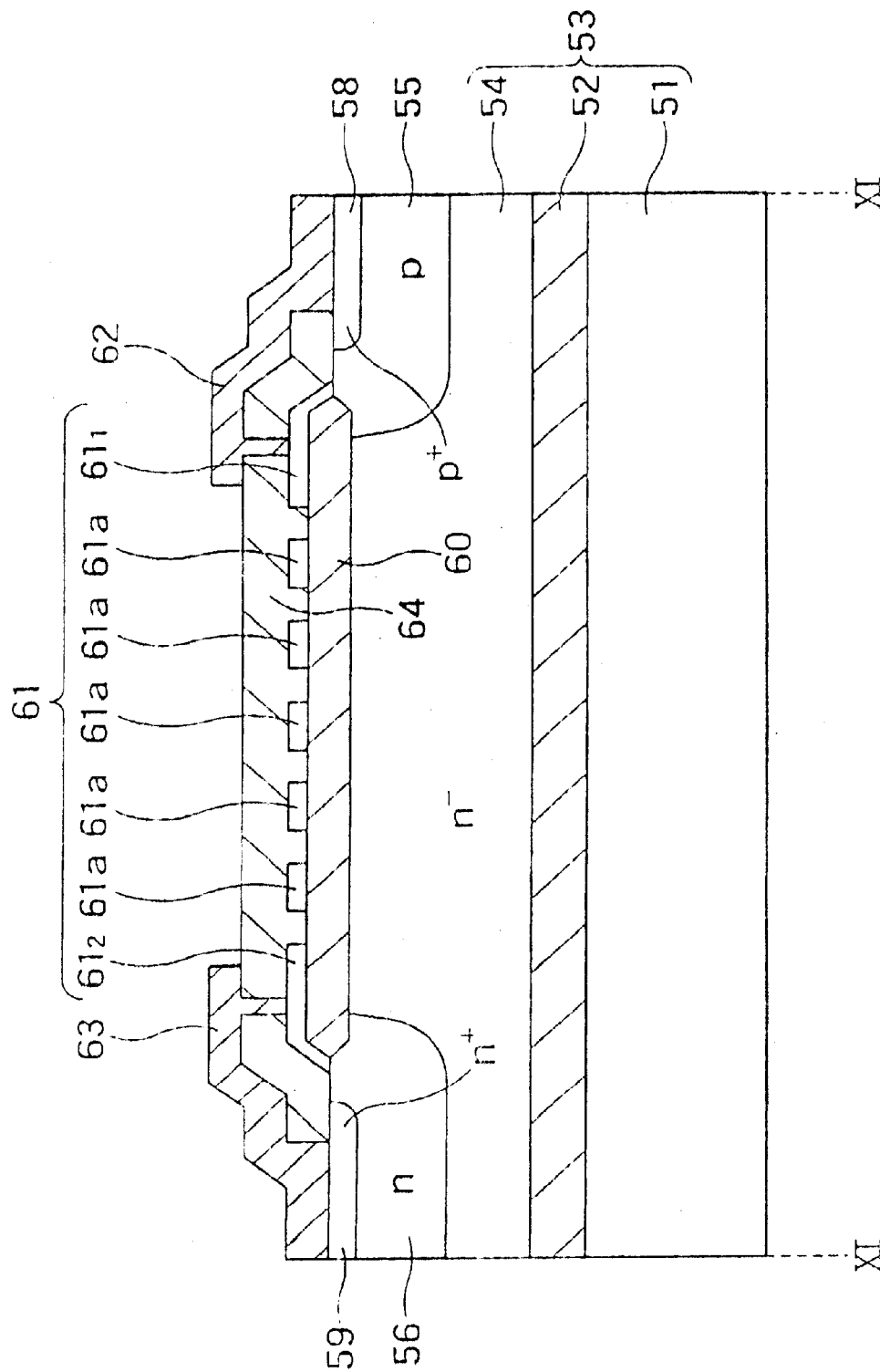
FIG. 11 is a cross-sectional view taken along the line XI—XI shown in FIG. 11.

A resistive field plate 21 in the high withstand voltage semiconductor device is, unlike the resistive field plate in the first embodiment, shaped in vortex (see FIG. 10). The innermost part $21_1$ of the vortex is connected to the second cathode 16 while the outermost part $21_2$ of the vortex is connected to the second anode 15. Then, a vortex conductive field plate 22 occupies an area right above a space defined between adjacent circular extensions of the resistive field plate 21 with an interlayer insulation film (not shown) intervening between the field plates. The conductive field plate 22 is divided into segments. The remaining parts of the structure are similar to those of the first embodiment, and further details are omitted.

Configured in this manner, the similar effects as in the first embodiment can be attained; that is, even with a broader pitch of the vortex, the substrate develops a uniform distribution of electric field in its surface, which brings about a high withstand voltage characteristics.

In the aforementioned descriptions, the first and second embodiments are set forth independent of each other, but they may be combined with each other. For instance, a vortex resistive field plate may be superposed with an annular conductive field plate. In such a case, only part of the conductive field plate occupies the areas right above the spaces defined between the adjacent circular extensions of the resistive field plate, but the similar effects as in the first and second embodiments can be obtained.

Also, the aforementioned first and second embodiments are described in a form of the lateral diode, but other forms of lateral high withstand voltage semiconductor device, such as an IGBT, a MOSFET, and the like may be alternatives to it.

Moreover, in the first and second embodiments, the substrate is a SOI substrate, but the present invention is not precisely limited to the SOI substrate in its true scope of application. For example, the present invention is applicable to ordinary silicon substrates.

[Third Embodiment]

A third embodiment of the present invention will now be described.

The third embodiment of the present invention employs a coupling terminating technique where resistive field plate and conductive field plate are uniquely used. This embodiment will be further detailed below.

Figure 7:
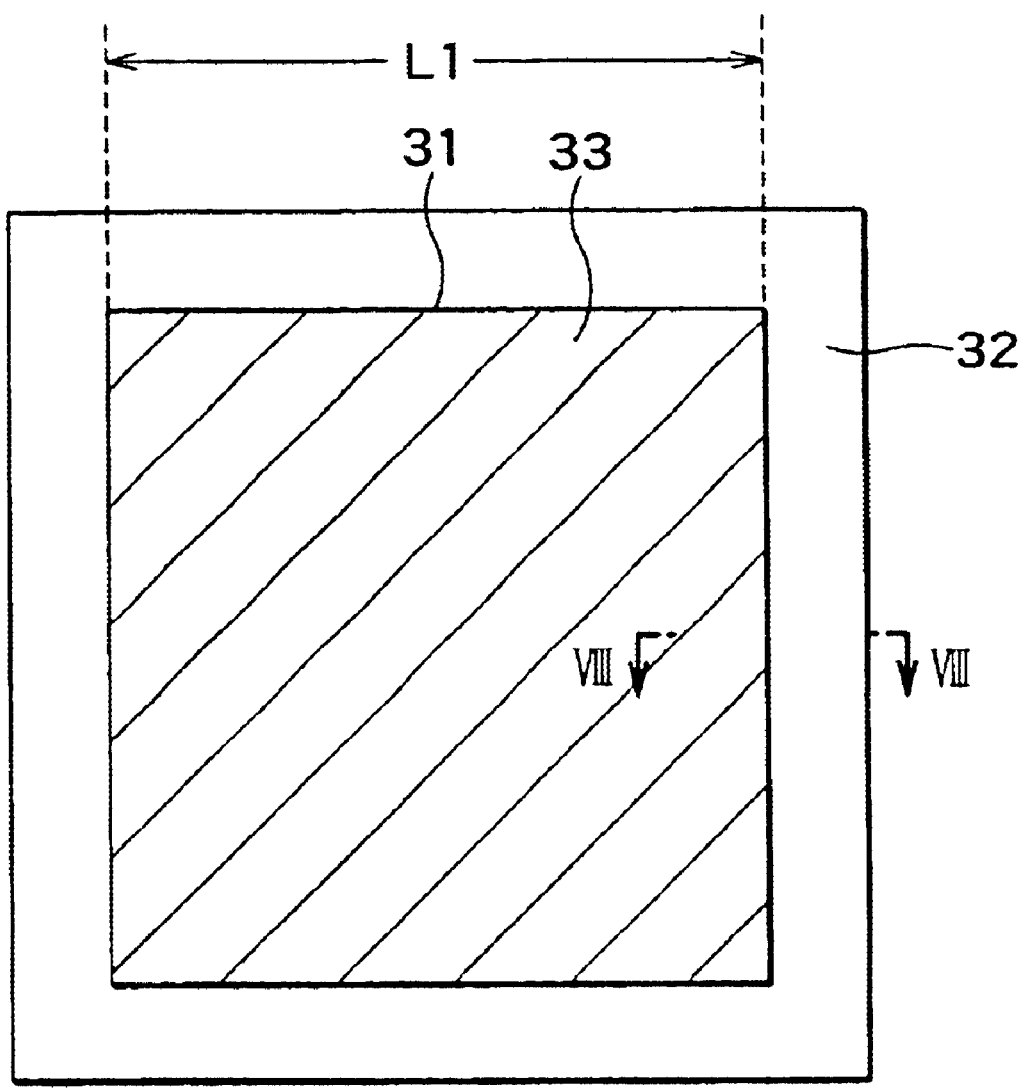
FIG. 7 is a plan view showing a third embodiment of the high withstand voltage semiconductor device.

FIG. 7 is a plan view showing the third embodiment of the high withstand voltage semiconductor device. The high withstand voltage semiconductor device is depicted herein as an example of a power MOSFET consisting of a device region 31 and a terminating region 32. The device region 31 has a width L1 of 2 mm, for example. A reference numeral 33 in the figure denotes a source electrode.

Figure 8:
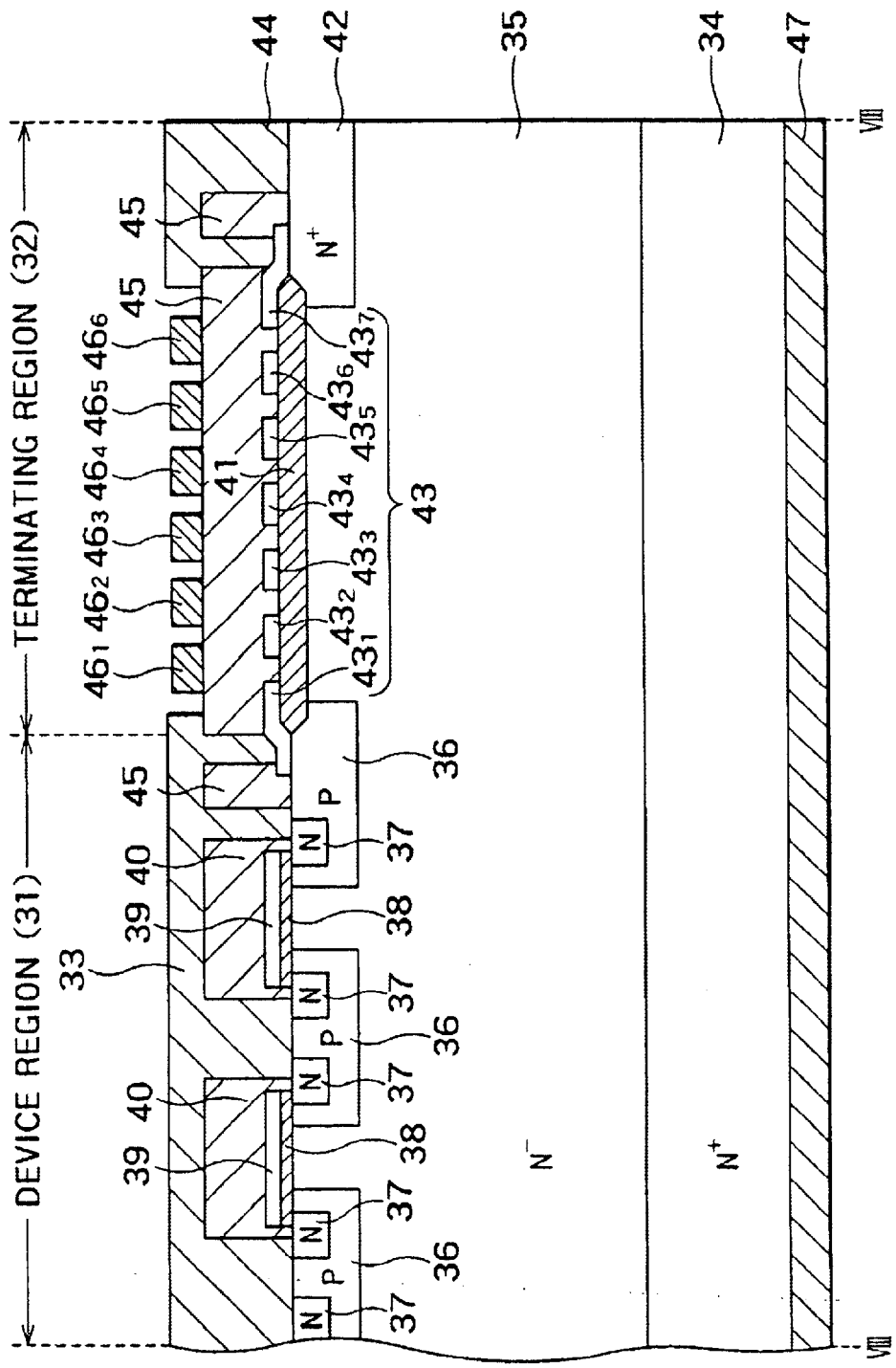
FIG. 8 is a cross-sectional view taken along the line VIII—VIII shown in FIG. 7.
Figure 9:
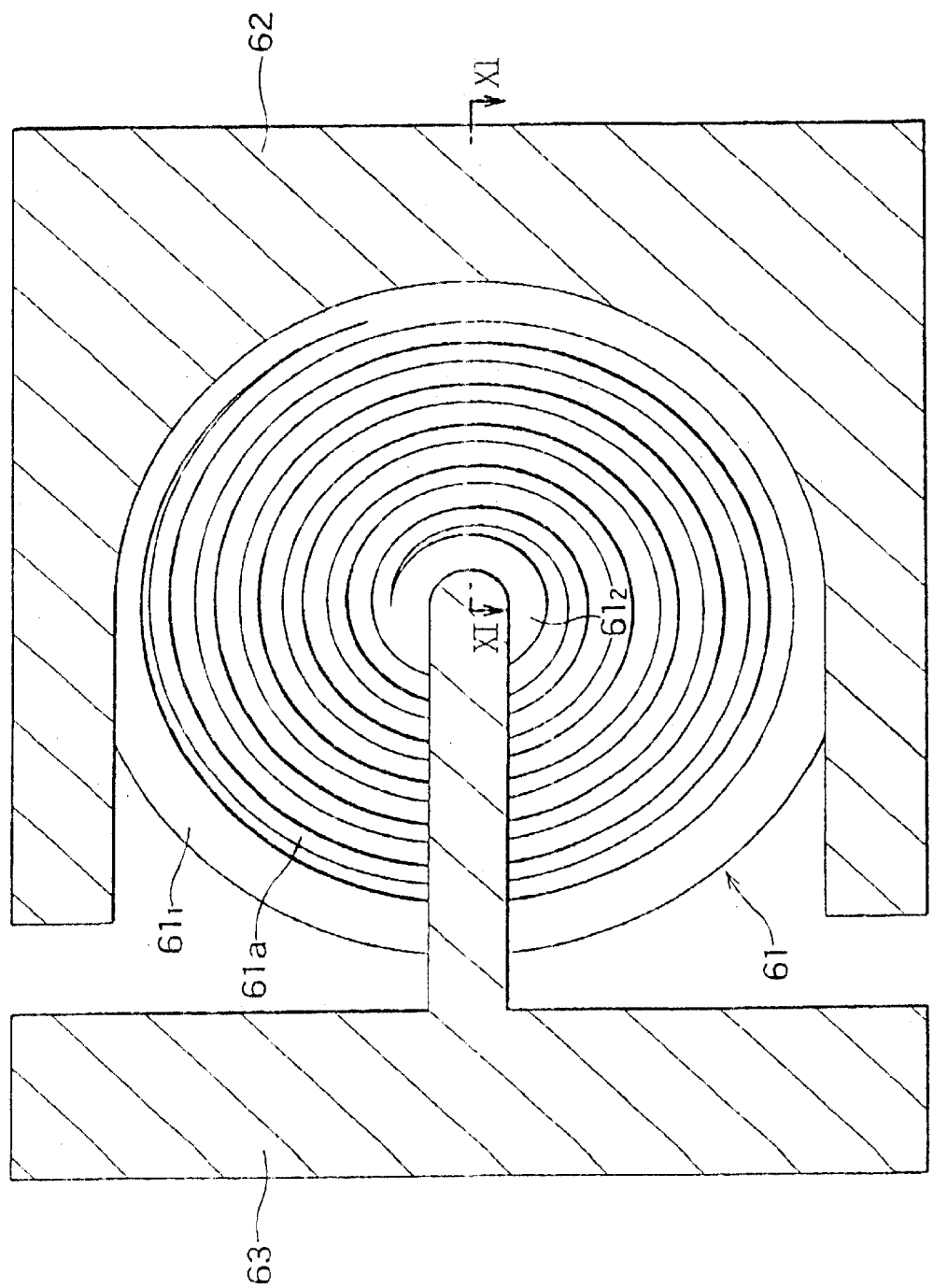
FIG. 9 is a plan view showing a prior art high withstand voltage semiconductor device with a resistive field plate.

FIG. 8 is a cross-sectional view taken along the line VIII—VIII of FIG. 7. As shown in FIG. 8, an n+ substrate 34 is superposed with an n− type epitaxial layer 35.

In an upper surface of the n− epitaxial layer 35 in the device region 31, a p type base region 36 is selectively formed, and, in turn, in the p type base region 36, an n type source region 37 is selectively formed. The n type source region 37, the p type base region 36, and the n− type epitaxial layer 35 are respectively superimposed with a gate electrode 39, with an interlayer insulation film 38 being interposed therebetween. An insulation film 40 is deposited over the top surface of the gate electrode 39 while a source electrode 33 is formed to cover the entire surface of the device region 31.

On the other hand, the n− type epitaxial layer 35 in the terminating region 32 is overlaid with an oxidation film 41. An n+ type contact region 42 is formed in the upper surface of the n− type epitaxial layer 35, with the device region 31 and the contact region 42 juxtaposed contiguous to the opposite sides of the intervening oxidation film 41. The n+ type contact region 42, the oxidation film 41, and the p type base region 36 adjacent to the oxidation film 41 are superposed with resistive field plate 43. The innermost resistive field plate $43_1$ is electrically connected to the source electrode 33 while the outermost resistive field plate $43_7$ is electrically connected to the n+ type contact region 42.

The resistive field plates $43_1$ to $43_7$ together build an annular planar pattern (not shown) alongside the terminating region 32 in FIG. 7. Any pair of the adjacent resistive field plates is connected by band-shaped resistive field plate (not shown), similar to the first embodiment.

As illustrated in FIG. 8, the resistive field plate 43 has its upper surface covered with an interlayer insulation film 45 which is further overlaid with conductive field plate 46 (i.e., conductive field plates $46_1$ to $46_6$) in positions right above spaces defined by adjacent ones of the resistive field plates $43_1$ to $43_7$. The conductive field plates $46_1$ to $46_6$ are in annular arrangement as if they were floating like island-shaped.

In upper surfaces of the n+ type contact region 42 and the annular resistive field plate $43_7$, a terminating electrode 44 is formed. Thus, the terminating electrode 44 and the source electrode 33 are electrically connected to each other with the interposed resistive field plate 43 of high resistance.

In the reverse side of the n+ type substrate 34, a drain electrode 47 is formed.

In the device configured in the aforementioned manner, positive voltage is applied to the drain electrode 47 while negative or zero voltage is applied to the source electrode 33 (e.g., withstand voltage is applied between the source electrode and the drain electrode).

Upon the application of voltage, small current flows from the terminating electrode 44 toward the source electrode 33 via the resistive field plate 43 of high resistance. Simultaneously, capacities are formed between the resistive field plates $43_1$ to $43_7$ and the conductive field plates $46_1$ to $46_6$, respectively, similar to the first embodiment.

As will be recognized from the above statements, the n− type epitaxial layer 35 in the terminating region 32 exhibits a uniform distribution of electric field in its surface. Thus, a depletion layer formed between part of the p type base region 36 contiguous to the oxidation film 41 and the n− type epitaxial layer 35 spreads broader in the vicinity of the n+ type contact region 42. This brings about a high withstand voltage characteristics.

A vertical MOSFET is exemplified in the context of the above-mentioned third embodiment, but the present invention can be applied in any other form of the vertical high withstand voltage semiconductor device such as an IGBT, a diode, and the like.

Thus, in accordance with the present invention, conductive field plate is provided in positions right above spaces defined between adjacent circular extensions of resistive field plate having its one end connected to a first principal electrode and the other end connected to a second principal electrode, and upon application of voltage between the first and second principal electrodes, capacities formed between the resistive field plate and the conductive field plate cause a consistently gradual variation in potential across the formed spaces, from one end toward the opposite end, which eventually causes relieveation of the electric field. This brings about a high withstand voltage characteristics.

What is claimed is:

1. A high withstand voltage semiconductor device, comprising:
    a substrate,
    a semiconductor layer formed on an upper surface of the substrate,
    a lateral semiconductor device formed in a surface region of the semiconductor layer and having a first principal electrode in its inner location and a second principal electrode in its outer location so as to let primary current flow between the first and second principal electrodes,
    a field insulation film formed inside from the second principal electrode in an upper surface of the semiconductor layer to surround the first principal electrode,
    a resistive field plate formed on an upper surface of the field insulation film to surround the first principal electrode and sectioned in a plurality of circular field plates in an approximate circular arrangement orbiting gradually from the vicinity of the first principal electrode toward the second principal electrode, the innermost one of the circular field plates being electrically connected to the first principal electrode while the outermost one is electrically connected to the second principal electrode, and the resistive field plate including coupling field plates which respectively connect adjacent ones of the circular field plates, and
    a conductive field plate shaped in a floating island right above spaces defined between adjacent pairs of the plurality of circular field plates, an interlayer insulation film being interposed between the conductive field plate and the resistive field plate or the circular field plates, and upon an application of voltage between the first and second principal electrodes, capacities being formed between the conductive field plate and the resistive field plate.

2. The high withstand voltage semiconductor device according to claim 1, wherein said substrate is SOI (Silicon on Insulator) substrate.

3. The high withstand voltage semiconductor device according to claim 1, wherein said substrate is ordinary silicon substrate.

4. The high withstand voltage semiconductor device according to claim 1, wherein the resistive field plate is shaped in vortex.

5. The high withstand voltage semiconductor device according to claim 4, wherein the conductive field plate is shaped in vortex orbiting right above spaces defined between adjacent circular extensions of the resistive field plate and is divided in sections.

6. The high withstand voltage semiconductor device according to claim 1, wherein the plurality of circular field plates of the resistive field plate are arranged in concentric.

7. The high withstand voltage semiconductor device according to claim 6, wherein said conductive field plate has its floating islands in concentric arrangement right above the spaces defined between the plurality of adjacent circular field plates of the resistive field plate.

8. The high withstand voltage semiconductor device according to claim 7, wherein each of the floating islands of the conductive field plate occupies an area corresponding to two or more of the spaces defined between adjacent ones of the circular field plates of the resistive field plate.

9. A high withstand voltage semiconductor device, comprising:
   a vertical semiconductor device having first and second principal electrodes in first and second major surfaces of a semiconductor substrate so as to let primary current flows between the first and second principal electrodes, and
   a terminating region including
   (i) a field electrode provided in an outer circumferential area in the first major surface of the semiconductor substrate, being spatially isolated in a direction parallel to the major surfaces of the substrate from the first principal electrode,
   (ii) a field insulation film formed inside from the field electrode in the semiconductor substrate to surround the first principal electrode,
   (iii) a resistive field plate formed in an upper surface of the field insulation film to surround the first principal electrode and sectioned in a plurality of circular field plates in an approximate circular arrangement orbiting gradually from the vicinity of the first principal electrode toward the field principal electrode, the innermost one of the circular field plates being electrically connected to the first principal electrode while the outermost one is electrically connected to the field electrode, and the resistive field plate including coupling field plates which respectively connect adjacent ones of the circular field plates, and
   (iv) a conductive field plate shaped like floating islands right above spaces defined between pairs of the adjacent circular field plates, an interlayer insulation film being interposed between the conductive field plate and the resistive field plate or the circular field plates, and upon an application of voltage between the first principal electrode and the field electrode, capacities being formed between the conductive field plate and the resistive field plate.

10. The high withstand voltage semiconductor device according to claim 9, wherein the conductive field plate is shaped in vortex orbiting right above spaces defined between adjacent circular extensions of the resistive field plate and is divided in sections.

11. The high withstand voltage semiconductor device according to claim 9, wherein said plurality of circular field plates are in concentric arrangement.

12. The high withstand voltage semiconductor device according to claim 11, wherein the conductive field plate has its floating islands in concentric arrangement right above the spaces defined between adjacent circular field plates of the resistive field plate.

* * * * *